(12) United States Patent
Ellä

(10) Patent No.: US 6,862,441 B2
(45) Date of Patent: Mar. 1, 2005

(54) TRANSMITTER FILTER ARRANGEMENT FOR MULTIBAND MOBILE PHONE

(75) Inventor: Juha Ellä, Halikko (FI)

(73) Assignee: Nokia Corporation, Espoo (FI)

( * ) Notice: Subject to any disclaimer, the term of this patent is extended or adjusted under 35 U.S.C. 154(b) by 102 days.

(21) Appl. No.: 10/458,797

(22) Filed: Jun. 9, 2003

(65) Prior Publication Data

US 2004/0248614 A1 Dec. 9, 2004

(51) Int. Cl.[7] .................................. H04B 1/10
(52) U.S. Cl. ................. 455/307; 455/249.1; 455/296; 455/63.1; 455/67.13; 455/114.2
(58) Field of Search ............... 455/307, 249.1, 455/296, 63.1, 67.13, 114.2

(56) References Cited

U.S. PATENT DOCUMENTS

| | | | |
|---|---|---|---|
| 5,185,589 A | 2/1993 | Krishnaswamy et al. ... | 333/133 |
| 6,081,171 A | 6/2000 | Ellä ........................... | 333/189 |
| 6,101,371 A | * 8/2000 | Barber et al. ................ | 455/73 |
| 6,242,843 B1 | * 6/2001 | Pohjonen et al. ....... | 310/313 R |
| 2001/0052830 A1 | * 12/2001 | Noguchi et al. ............ | 333/133 |

FOREIGN PATENT DOCUMENTS

JP      2002319836 A * 10/2002 .......... H03H/7/075

* cited by examiner

Primary Examiner—Sonny Trinh
Assistant Examiner—Huy Phan
(74) Attorney, Agent, or Firm—Ware, Fressola, Van Der Sluys & Adolphson LLP (57) ABSTRACT

A filter arrangement for use in a multiband dual-mode mobile phone. In particular, the mobile phone is operable in a W-CDMA mode and a band-reject filter comprising at least a series and a shunt acoustic-wave resonators is used to create a deep notch at the receive frequency band. The band-reject filter further includes a plurality of inductive elements for matching static capacitance of the resonators at the passband frequency. The mobile phone is also operable in 1800 and 1900 GSM bands. The band-reject filter is operatively connected to a harmonic trap in order to eliminate the third harmonic of these GSM bands. The mobile phone is also operable in the lower GSM band, for which a harmonic filter can share an antenna path with the band-reject filter.

29 Claims, 9 Drawing Sheets

(PRIOR ART)

TRANSMITTER FILTER ARRANGEMENT FOR MULTIBAND MOBILE PHONE

FIELD OF THE INVENTION

The present invention relates generally to thin-film bulk acoustic wave filters and, more particularly, to bulk acoustic wave filters in mobile phone front-end.

BACKGROUND OF THE INVENTION

Figure 1A:
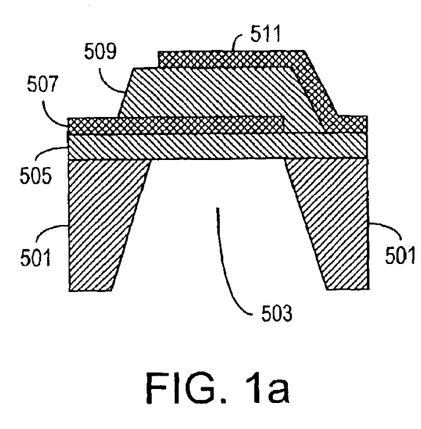
FIG. 1a is a cross-sectional view illustrating a typical bulk acoustic wave device having a resonator and a membrane formed on a substrate, wherein the substrate has a through hole for providing an air interface for the membrane.
Figure 1B:
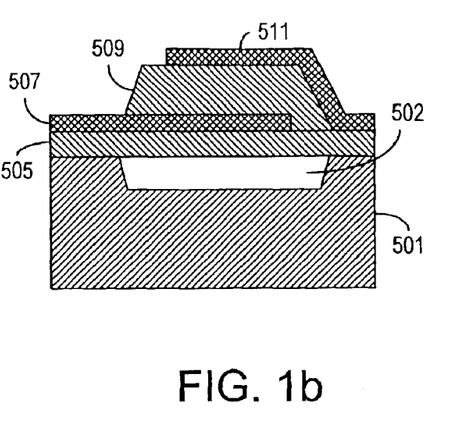
FIG. 1b is a cross-sectional view illustrating a typical bulk acoustic wave device having a resonator and a membrane formed on a substrate, wherein the substrate has an etched section for providing an air interface for the membrane.
Figure 1C:
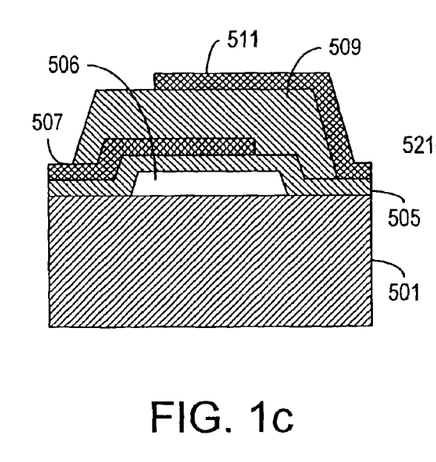
FIG. 1c is a cross-sectional view illustrating a typical bulk acoustic wave device having a resonator and a membrane formed on a substrate, wherein a sacrificial layer is formed between the membrane and the substrate.
Figure 1D:
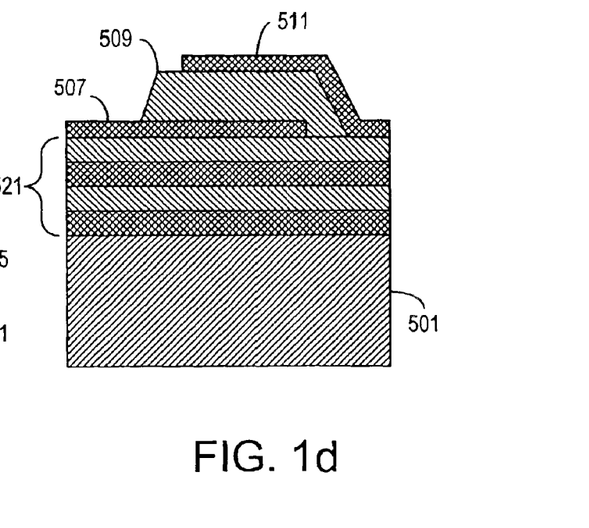
FIG. 1d is a cross-sectional view illustrating a typical bulk acoustic wave device having a resonator and a membrane formed on a substrate, wherein an acoustic mirror is formed between the substrate and the bottom electrode of the resonator.

It is known that a bulk acoustic-wave (BAW) device is, in general, comprised of a piezoelectric layer sandwiched between two electronically conductive layers that serve as electrodes. When a radio frequency (RF) signal is applied across the device, it produces a mechanical wave in the piezoelectric layer. The fundamental resonance occurs when the wavelength of the mechanical wave is about twice the thickness of the piezoelectric layer. Although the resonant frequency of a BAW device also depends on other factors, the thickness of the piezoelectric layer is the predominant factor in determining the resonant frequency. As the thickness of the piezoelectric layer is reduced, the resonance frequency is increased. BAW devices have traditionally been fabricated on sheets of quartz crystals. In general, it is difficult to achieve a device of high resonance frequency using this fabrication method. When fabricating BAW devices by depositing thin-film layers on passive substrate materials, one can extend the resonance frequency to the 0.5–10 GHz range. These types of BAW devices are commonly referred to as thin-film bulk acoustic resonators or FBARs. There are primarily two types of FBARs, namely, BAW resonators and stacked crystal filters (SCFs). An SCF usually has two or more piezoelectric layers and three or more electrodes, with some electrodes being grounded. The difference between these two types of devices lies mainly in their structure. FBARs are usually used in combination to produce passband or stopband filters. The combination of one series FBAR and one parallel, or shunt, FBAR makes up one section of the so-called ladder filter. The description of ladder filters can be found, for example, in Ella (U.S. Pat. No. 6,081,171). As disclosed in Ella, an FBAR-based device may have one or more protective layers commonly referred to as the passivation layers. A typical FBAR-based device is shown in FIGS. 1a to 1d. As shown in FIGS. 1a to 1d, the FBAR device comprises a substrate 501, a bottom electrode 507, a piezoelectric layer 509, and a top electrode 511. The electrodes and the piezoelectric layer form an acoustic resonator. The FBAR device may additionally include a membrane layer 505. As shown in FIG. 1a, an etched hole 503 is made on the substrate 501 to provide an air interface, separating the resonator from the substrate 501. Alternatively, an etched pit 502 is provided on the substrate 501, as shown in FIG. 1b. It is also possible to provide a sacrificial layer 506 separating the resonator and the substrate, as shown in FIG. 1c. It is also possible to form an acoustic mirror 521 between the bottom electrode 507 and the substrate 501 for reflecting the acoustic wave back to the resonator. The substrate can be made from silicon (Si), silicon dioxide ($SiO_2$), Gallium Arsenide (GaAs), glass or ceramic materials. The bottom electrode and top electrode can be made from gold (Au), molybdenum (Mo), tungsten (W), copper (Cu), nickel (Ni), titanium (Ti), Niobium (Nb), silver (Ag), tantalum (Ta), cobalt (Co), aluminum (Al) or a combination of these metals, such as tungsten and aluminum. The piezoelectric layer 130 can be made from zinc oxide (ZnO), zinc sulfide (ZnS), aluminum nitride (AlN), lithium tantalate ($LiTaO_3$) or other members of the so-called lead lanthanum zirconate titanate family. Additionally, a passivation layer typically made from a dielectric material, such as $SiO_2$, $Si_3N_4$, or polyimide, is used to serve as an electrical insulator and to protect the piezoelectric layer. It should be noted that the sacrificial layer 506 in a bridge-type BAW device, as shown in FIG. 1c, is, in general, etched away in the final fabrication stages to create an air interface beneath the device. In a mirror-type BAW device, as shown in FIG. 1d, the acoustic mirror 521 consists of several layer pairs of high and low acoustic impedance materials, usually a quarter-wave thick. The bridge-type and the mirror-type BAW devices are known in the art.

The disadvantages of the membrane type approach are that it is difficult to produce the layers 507, 509, 511 on top of the membrane 505 so that they have sufficiently small mechanical stress, which would break or bend the membrane 505. Moreover, the membrane structure is not very rugged mechanically, which complicates the handling and dicing of the wafers. The mirror structure is clearly more rugged because the whole structure is solidly mounted on the substrate 501. As such, the mirror structure provides better thermal relief to the substrate in high power applications.

Figure 2:
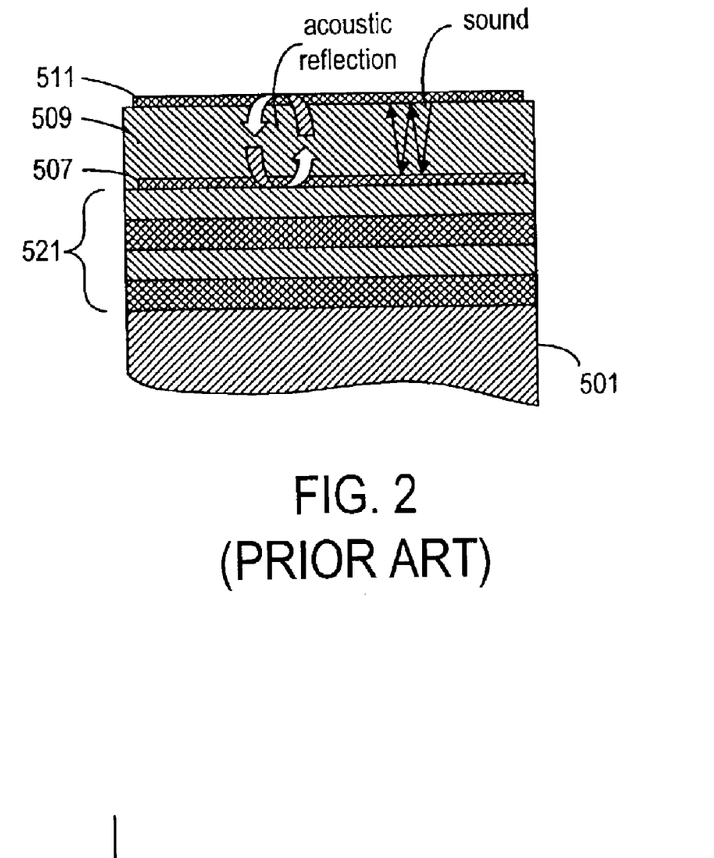
FIG. 2 is a schematic representation illustrating how a resonance is formed in a typical mirror-type BAW device.
Figure 3:
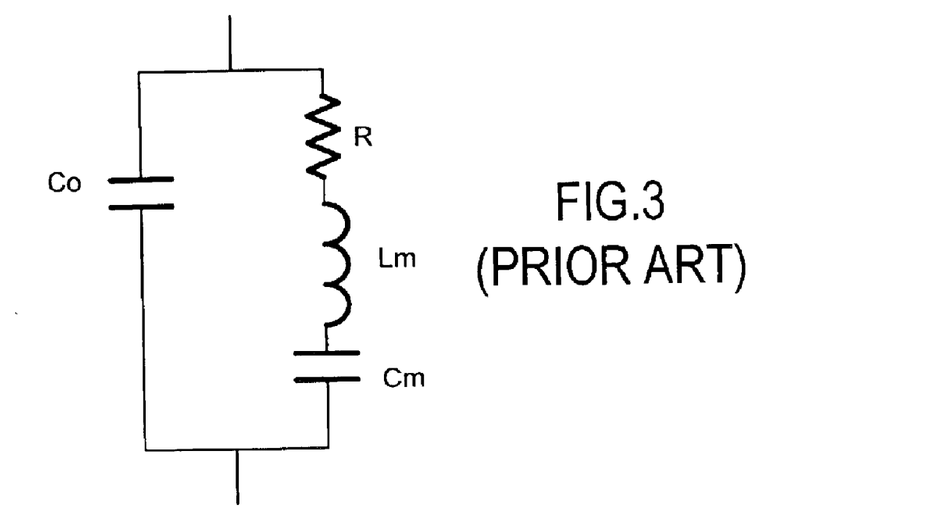
FIG. 3 shows an equivalent circuit of a typical BAW resonator.
Figure 4A:
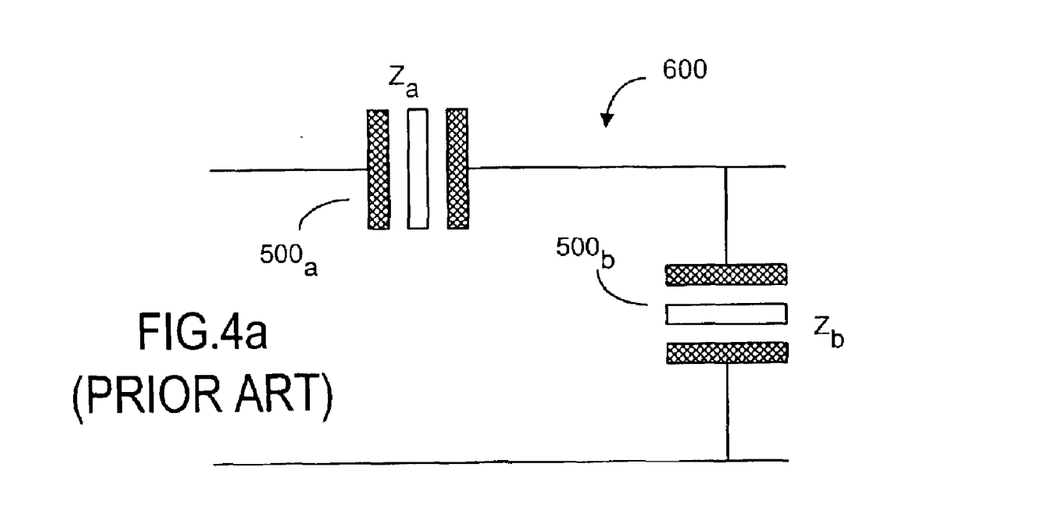
FIG. 4a shows an L-section of a ladder filter formed by a series resonator and a shunt resonator.
Figure 4B:
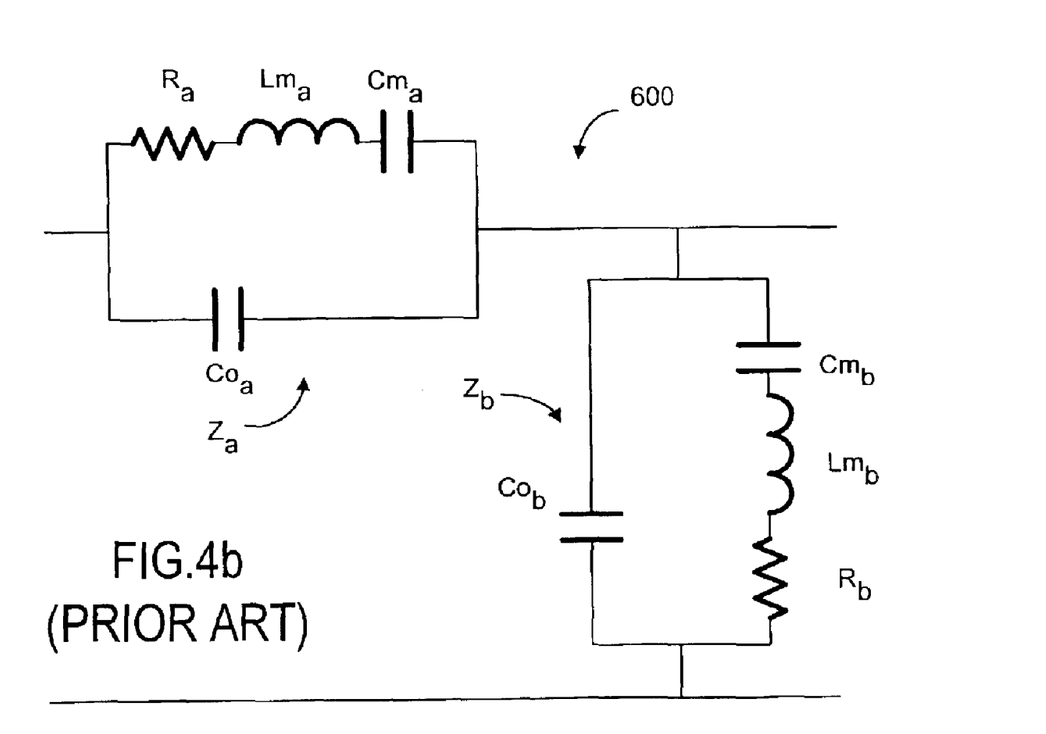
Figure 5:
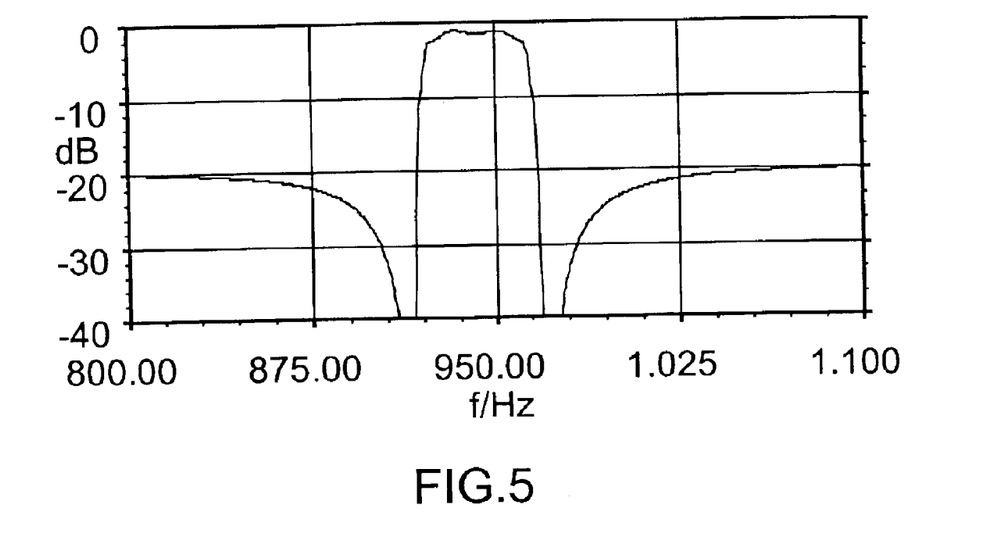
FIG. 5 is a plot showing a typical frequency response of a ladder filter with 3 L-sections.

The mirror operates basically as a $\lambda/4$ transformer in that it consists of multiple pairs of alternating layers with high and low acoustic impedance, each of which is acoustically about one quarter wavelength thick. Thus, the whole stack transforms the impedance of the substrate to a very low impedance at the mirror/bottom electrode interface, creating an acoustically reflective interface similar to the air-interface in membrane type structures. The optimal operation of the mirror requires that the difference in the high and low impedance is as large as possible. In a mirror type BAW, the air-interface and the acoustic mirror form a cavity therebetween for confining the acoustic energy in an acoustic resonance, as shown in FIG. 2. The equivalent circuit of anyone of the BAW resonators mentioned-above is shown in FIG. 3. The equivalent circuit includes an equivalent resistance (R), an equivalent inductor (Lm), an equivalent capacitance (Cm), and a parallel parasitic capacitance (Co). As such, BAW resonators can be used as building blocks in impedance elements filters, such as ladder and lattice filters. Both ladder and lattice filters are known in the art. For example, ladder filters are disclosed in Ella. The basic unit in a ladder filter is an L-section 600, as shown in FIG. 4a. The L-section 600 includes two BAW resonators, a series resonator 500a and a shunt resonator 500b. When the L-section is used as a bandpass filter, the resonance frequency of the shunt resonator is designed to be slightly lower than that of the series resonator. The idea is to have the parallel resonance (=ideally infinite impedance) of the shunt resonator and the series resonance of the series resonator (=ideally zero impedance) at or close to the center frequency of the passband. The equivalent circuit for the L-section 600 is shown in FIG. 4b. The frequency response of a typical bandpass filter consisting of several (in this case 3) L-sections 600 is shown in FIG. 5. As shown in FIG. 5, the frequency response has a passband section centered about 940 MHz. In the response as shown in FIG. 5, the notch below the passband is due to the series resonance of the shunt resonator (signal being effectively grounded), and the notch above the passband is caused by the parallel resonance of the parallel resonator (signal seeing an infinite series resistance). The passband characteristics of BAW resonator combination can be improved by using two or more L-sections. The number of L-sections mostly influences the amount of attenuation outside the passband. It should be noted that ladder filters are usually referred to as having complete stages. Those ladder filters include equal number of series and shunt resonators. However, a ladder filter can have, for example, 3 shunt resonators and two series resonators (referred to as 2.5 stages).

Figure 6:
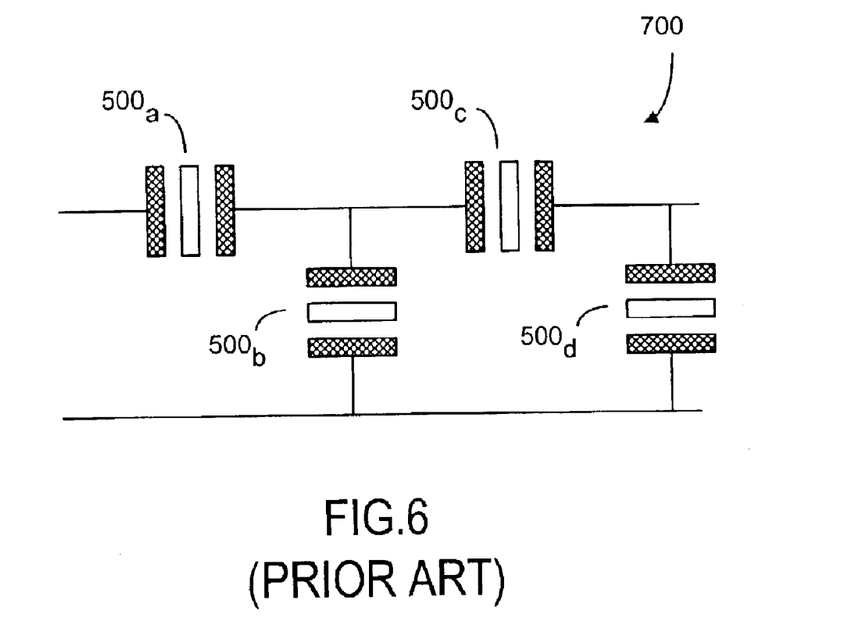
FIG. 6 is a schematic representation illustrating the topology of a prior art 2-stage band-reject filter.
Figure 7:
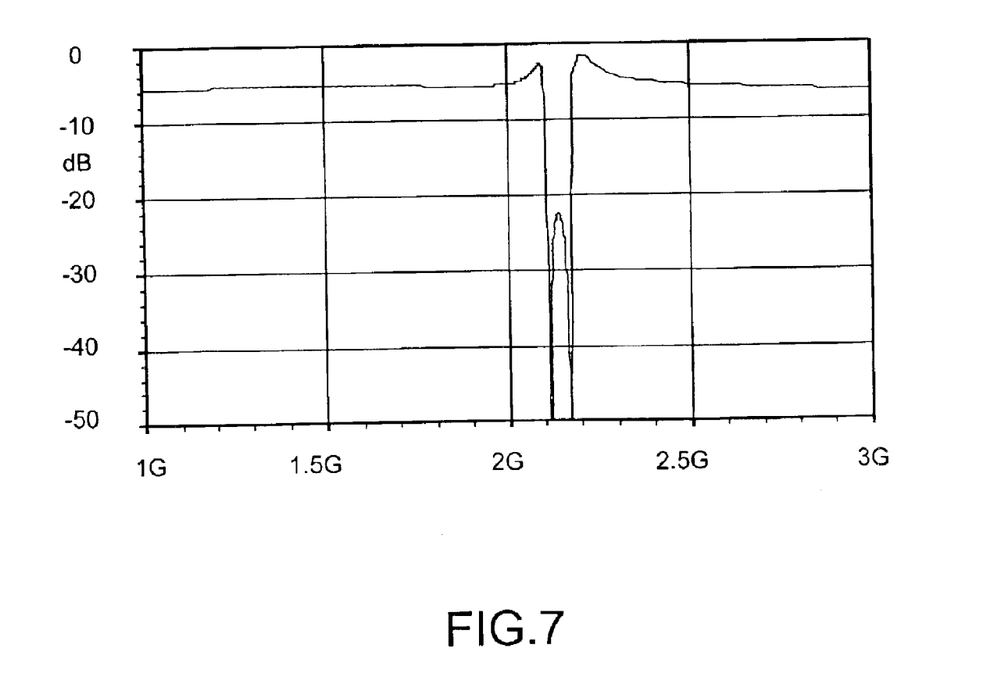
FIG. 7 is a plot showing a typical frequency response of a 2-stage band-reject filter of FIG. 6.

In addition to using L-sections as passband filters, it is known in the art to make band-reject filters by switching the roles of series and shunt resonators. In this case, the series-connected resonators (500a, 500c) have their parallel resonance and the shunt resonators (500b, 500d) their series resonance at the intended stop-band, so as to provide a deep and steep notch at this frequency. The topology of such a filter with 2 L-sections is shown in FIG. 6, and the typical response of such filter is shown in FIG. 7. The response is, in principle, a mirror image of the passband ladder filter (see FIG. 5), in that the minimum insertion loss occurs at the "notch" frequencies below and above the stop band. The filter in such a format is, however, not very useful because the insertion loss outside the designated reject frequencies is still very large, typically from 3 to 6 dB, depending on the design. Accordingly, such a filter is not very useful as a band-reject filter in a multiband, double-mode mobile phone engine front-end.

SUMMARY OF THE INVENTION

It is a primary object of the present invention to provide in a transmitter module a filter having a good attenuation at a certain frequency and, more particularly, at the W-CDMA receive frequency and a small attenuation at the W-CDMA transmit frequency. This object can be achieved by disposing an acoustic-wave filter comprising one or more L-sections of a ladder filter and frequency matching components in the transmitter module. The L-section comprises a series resonator and a shunt resonator such that a deep and steep notch for attenuating the W-CDMA receive frequency is achieved by the resonator characteristics, and that the resonators appear at the transmit frequency as passive coupling elements.

Thus, according to the first aspect of the present invention, there is provided a method of filtering transceiver signals in a mobile terminal, the mobile terminal operating in at least one transmit frequency band and one receive frequency band separated from the transmit frequency band, wherein the mobile terminal has a signal source for providing transmit signal in the transmit frequency band. The method comprises the steps of:

providing a signal path between the signal source and an antenna; and providing a band-reject filter in the signal path so as to attenuate signal in the receive frequency band, wherein the band-reject filter comprises:

at least one series resonator operatively connected between the signal source and the antenna, the series resonator having a first end and an opposing second end, with the first end connected to the signal source;

at least one shunt resonator connecting between the second end of the series resonator and a grounding point, the shunt resonator and the series resonator forming an L-section; and at least one inductor connected in parallel with the L-section.

The mobile terminal is operable in a code-division multiple access (CDMA) mode, and the transmit frequency band substantially occupies a frequency range of 1920 to 1980 MHz, and the receive frequency band substantially occupies a frequency range of 2110 to 2170 MHz.

The mobile terminal is also operable in a GSM mode, and also has a further signal source for providing a further transmit signal in the further transmit frequency band. The method further comprises the step of operatively connecting the further signal source to the signal path at the first end of the series resonator.

The further transmit frequency band includes a frequency range substantially of 1710 to 1785 MHz and a frequency range substantially of 1850 to 1910 MHz. The transmit frequency band can also substantially occupy a frequency range of 1710 to 1770 MHz for the forthcoming W-CDMA.

The band-reject filter is operatively connected to a harmonic trap, for attenuating a harmonic of the GSM mode.

Preferably, the series resonator comprises at least an acoustic wave resonator and the shunt resonator comprises another acoustic wave resonator. These acoustic wave resonators can be bulk acoustic wave or surface acoustic wave resonators.

According to the second aspect of the present invention, there is provided a band-reject filter for use in a mobile terminal, the mobile terminal operating in at least one transmit frequency band and one receive frequency band separated from the transmit frequency band, wherein the mobile terminal has a signal source for providing transmit signal in the transmit frequency band, and a signal path between the signal source and an antenna. The filter comprises:

at least one series resonator operatively connected to the signal path between the signal source and the antenna, the series resonator having a first end and an opposing second end, with the first end connected to the signal source;

at least one shunt resonator connecting between the second end of the series resonator and a grounding point, the shunt resonator and the series resonator forming an L-section; and at least one inductor connected in parallel with the L-section.

Said at least one inductor is connected between the first end of the series resonator and the grounding point, and the band-reject filter further comprises a further inductor connected between the second end of the series resonator and the grounding point.

The series resonator comprises a bulk or surface acoustic wave resonator and the shunt resonator comprises another bulk or surface acoustic wave resonator.

The transmit frequency band substantially occupies a frequency range of 1920 to 1980 MHz, and the receive frequency band substantially occupies a frequency range of 2110 to 2170 MHz in W-CDMA mode.

According to the third aspect of the present invention, there is provided a mobile terminal operating in at least one transmit frequency band and one receive frequency band separated from the transmit frequency band. The mobile terminal comprises:

a signal source for providing transmit signal in the transmit frequency band;

a signal path between the signal source and an antenna; and a band-reject filter operatively connected to the signal path so as to attenuate signal in the receive frequency band, wherein the band-reject filter comprises:

at least one series resonator operatively connected between the signal source and the antenna, the series resonator having a first end and an opposing second end, with the first end connected to the transmission source;

at least one shunt resonator connecting between the second end of the series resonator and a reference point, the shunt resonator and the series resonator forming an L-section; and at least one inductance connected in parallel with the L-section.

The transmit frequency band substantially occupies a frequency range of 1920 to 1980 MHz, and the receive frequency band substantially occupies a frequency range of 2110 to 2170 MHz in W-CDMA mode.

The mobile terminal is also operable in a GSM mode in further transmit frequency bands. The mobile terminal further comprises a further signal source, operatively connecting to the signal path at the first end of the series resonator, for providing a further transmit signal in the further transmit frequency band. The further transmit frequency band substantially occupies a frequency range of 1710 to 1785 MHz and a frequency range of 1850 to 1910 MHz.

The mobile terminal further comprises a harmonic trap, operatively connected to the band-reject filter, for attenuating a harmonic of the GSM mode.

The mobile terminal is further operable in a GSM900 transmit/receive mode. The mobile terminal further comprises a further signal source, operatively connecting to the antenna, for providing a further transmit signal in the GSM900 transmit band.

The present invention will become apparent upon reading the description taken in conjunction with FIGS. 8 to 13.

BRIEF DESCRIPTION OF THE DRAWINGS

FIG. 4b shows an equivalent circuit of an L-section of a ladder filter of FIG. 4a.

BEST MODE FOR CARRYING OUT THE INVENTION

Figure 8:
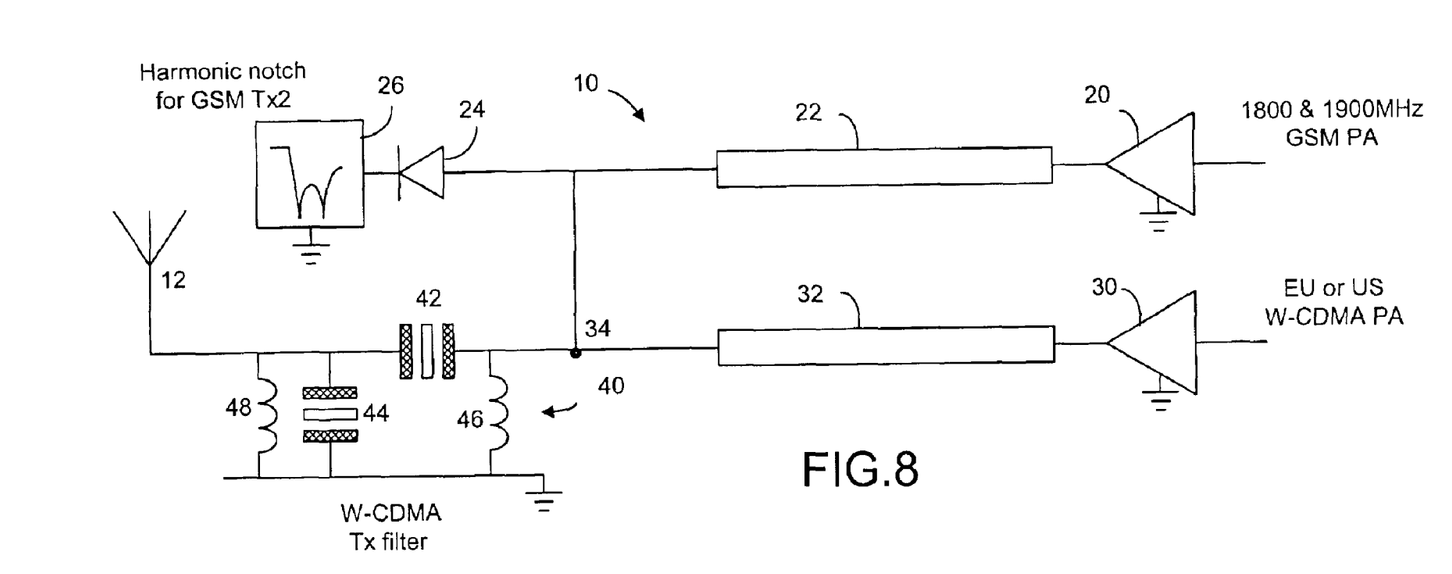
FIG. 8 is a schematic representation showing a band-reject filter for use in a transmitter module in multiband, double-mode mobile phone engine front-end, according to the present invention.
Figure 11:
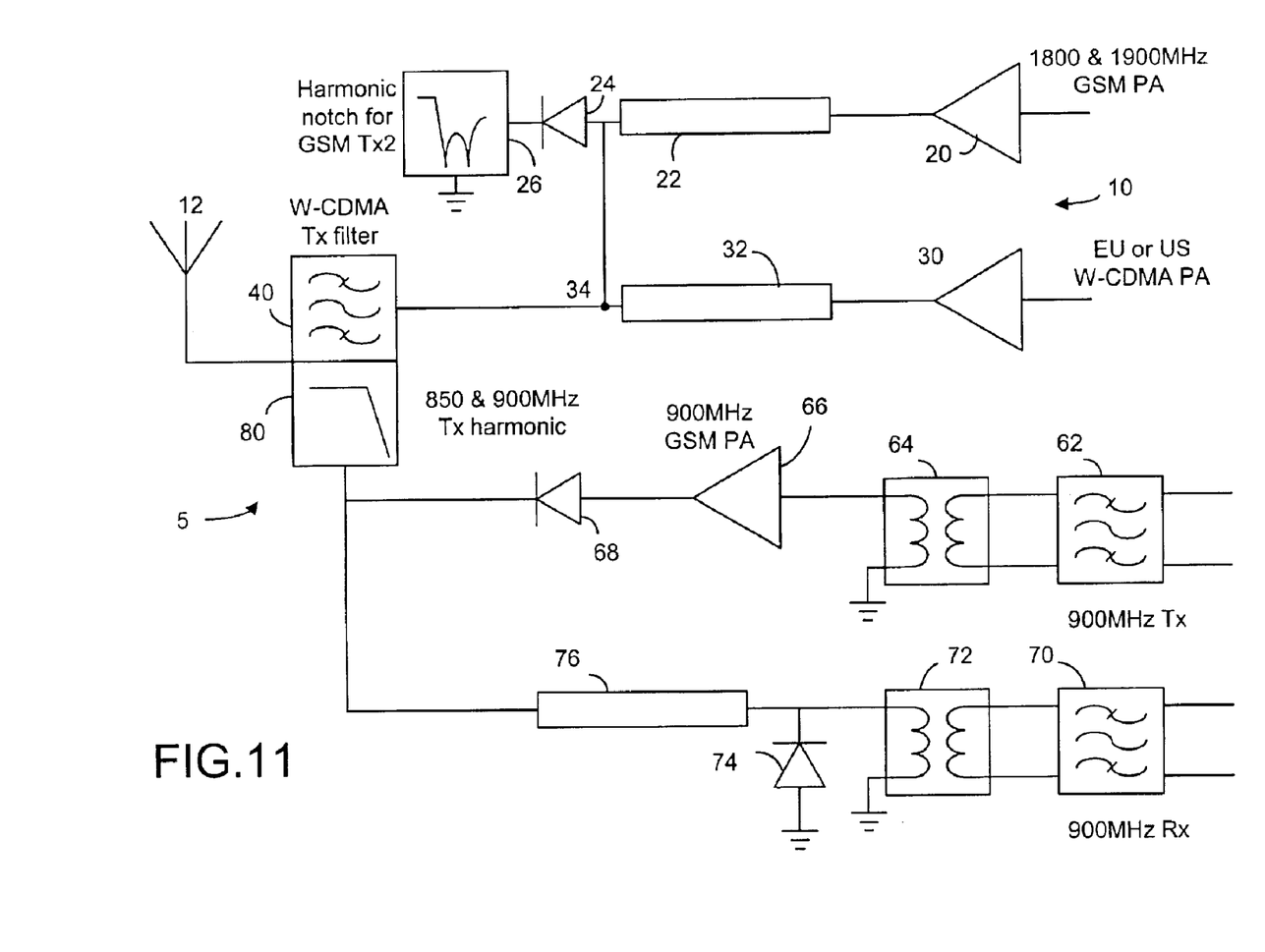
FIG. 11 is a schematic representation showing the linkage between the transmitter module of the present invention to a GSM transceiver module operating at 900 MHz.

In a multiband mobile terminal operating both in W-CDMA mode and in GSM mode, currently the front end is arranged to have two separate antennas, one for the W-CDMA frequency band and one for the GSM frequency bands. In the GSM mode, the transmitter and the receiver are separated by switching. In the W-CDMA mode, a duplexer or a diplexer is used. The present invention combines bandpass and band-reject filters using acoustic-wave resonators. The combined filter can be made to have a very deep notch at the W-CDMA receive frequency, while retaining wide passband (at least 30 MHz) with very low loss. The combined filter is shown as a band-reject filter 40 in FIGS. 8, 11 and 12. In particular, the combined filter is used in a front-end of a multiband, dual-mode mobile terminal (GSM+W-CDMA), as shown in FIGS. 8 and 11. The front-end is used herein to refer to the RF (radio frequency) parts that are disposed between a typical RF-asic(s) and an antenna. The front-end has a transmitter module for the 1800 & 1900 MHz GSM mode and a European or U.S. W-CDMA mode, and transceiver module for the lower GSM bands (see FIG. 11).

Figure 9A:
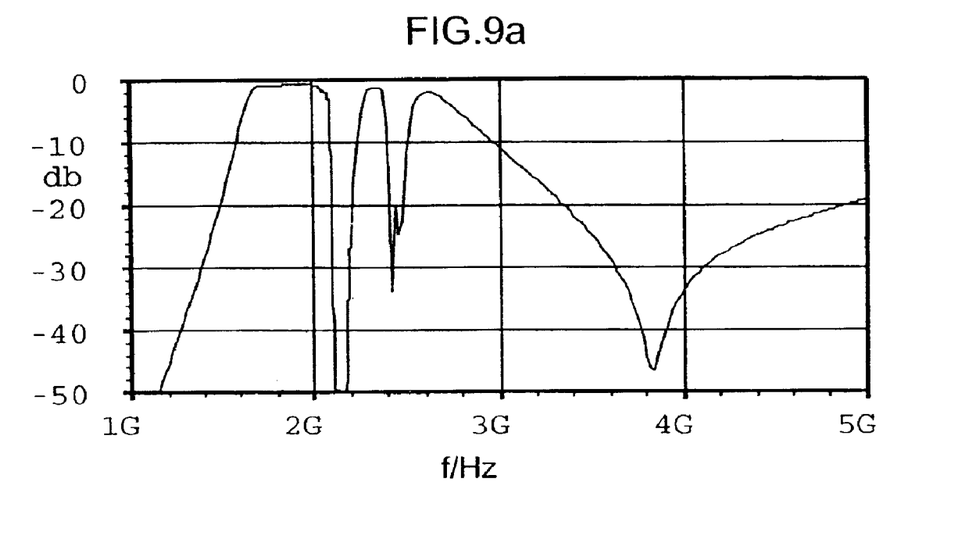
FIG. 9a is a plot showing a typical frequency response of the band-reject filter of the present invention.
Figure 9B:
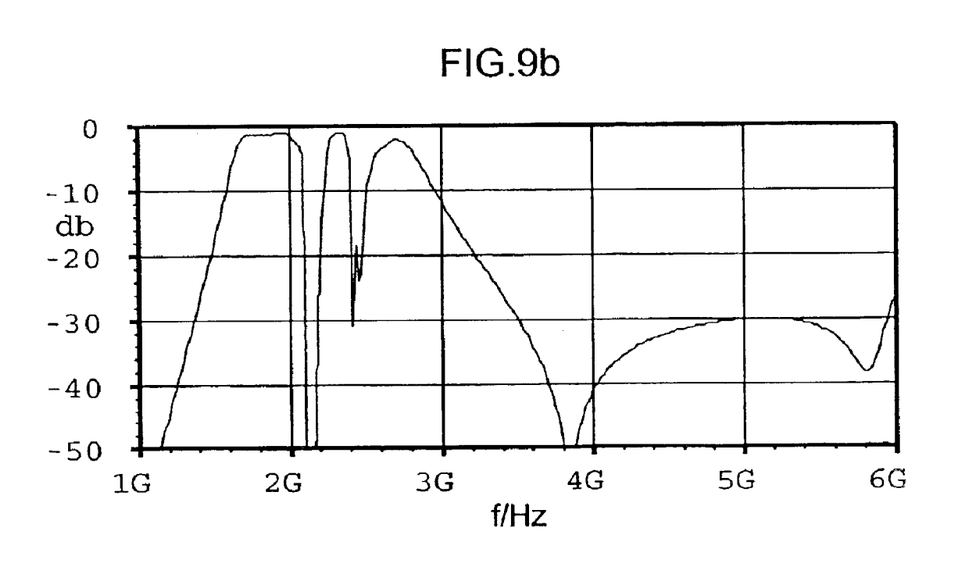
FIG. 9b is a plot showing a typical frequency response of the band-rejection filter cooperatively engaged with a harmonic trap.

As shown in FIG. 8, the transmitter module 10 comprises a signal path connecting the antenna 12 to two transmitter branches: one branch comprises a power amplifier 20 and an impedance matching element 22 for conveying transmit signals in the 1800 & 1900 GSM bands, and the other branch comprises a power amplifier 30 and an impedance matching element 32 for conveying transmit signals in the European or U.S. W-CDMA transmit frequency band. The branches are connected to a node 34. In order to attenuate the W-CDMA receive frequency, a band-reject filter 40 is connected between the antenna 12 and the node 34. The band-reject filter 40 has at least one L-section of a ladder filter. As shown, the L-section has two acoustic-wave resonators: a series resonator 42 connected between the antenna 12 and the node 34, and a shunt resonator 44 connected between one end of the series resonator 42 and a circuit ground. The band-reject filter 40 further comprises two small coils 46, 48. The coils 46, 48 are used to match the static capacitance of the resonators at the passband frequency. Typically, the coils are in the range of 0.8 nH to 3.5 nH. But these values depend strongly upon the filter design as well as the frequency and also upon the general impedance level. As such, the band-filter 40 creates a very deep notch at the W-CDMA receive frequency, while retaining wide passband (at least 300 MHz) with very low loss for the transmit frequencies. For example, if the series resonance of the series resonator 42 is chosen to be substantially equal to 2.06 GHz, which is slightly above the passband of W-CDMA transmit frequency band of 1920–1980 MHz, and the parallel resonance of the series resonator 42 is substantially equal to 2.114 GHz and the corresponding frequencies of the shunt resonator 44 are Fs=2.17 GHz and Fp=2.226 GHz, a deep notch is formed in the stopband beyond the transmit frequency band. A typical response of the band-reject filter 40 is shown in FIG. 9*a*. Such a filter arrangement can be used as a separate Tx module, as part of an antenna switch module. Furthermore, a harmonic trap 26, together with a diode 24 can be added to the transmitter module 10 in order to create a third harmonic notch for the 1800 and 1900 MHz bands. The response is shown in FIG. 9*b*. The harmonic trap 26 can be a coil or a simple resonant circuit consisting of a coil and a capacitor, for example. The diode 24 is used to minimize loss when the mobile terminal is operated in the W-CDMA mode and such a third harmonic notch is not necessary. Thus, when the mobile terminal is operated in the W-CDMA mode, the diode 24 is unbiased.

Figure 10A:
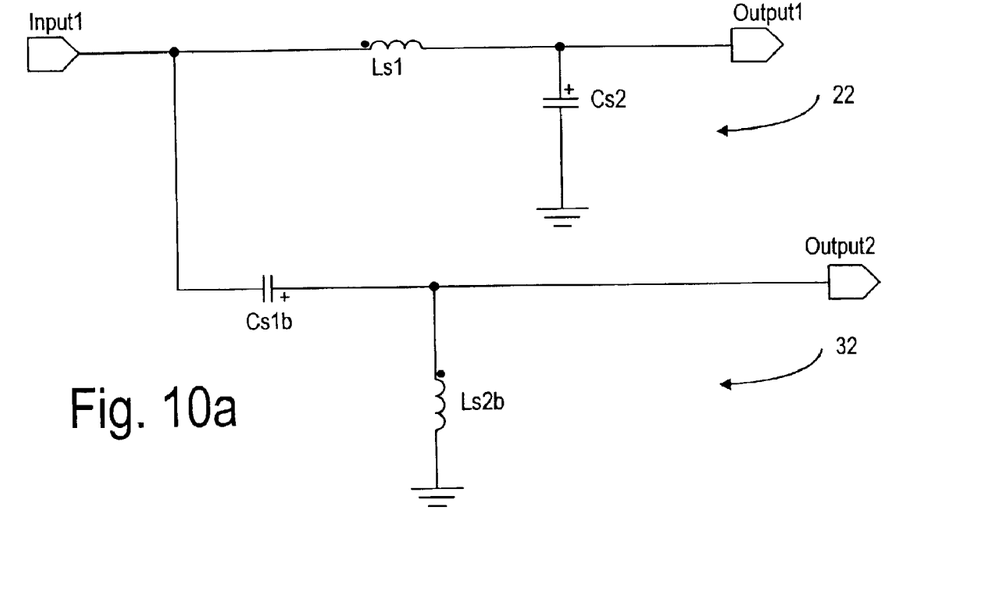
FIG. 10a is a circuit diagram showing a typical matching component which can be used to match and filter two transmit signals.
Figure 10B:
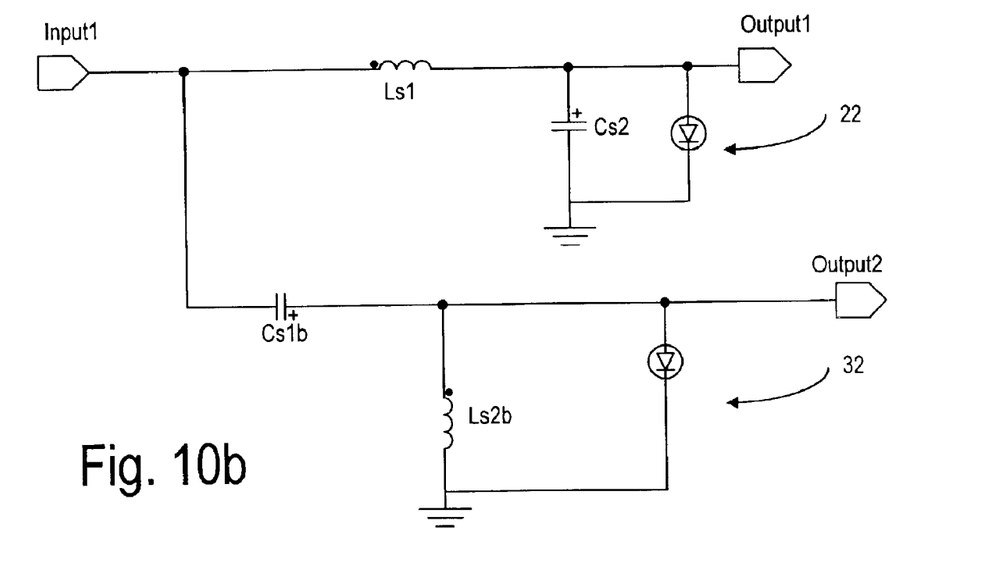
FIG. 10b is a circuit diagram showing another version of the matching component.

In the transmitter module 10, two Tx power amplifiers 20, 30 are used: one for the upper GSM bands and one for W-CDMA. It should be noted that, in a dual-mode mobile terminal, only one power amplifier is "on" at a time. Thus, it is possible to use switches to connect one power amplifier at a time to the filter 40. These switches can be part of a simple lowpass/highpass diplexer so that the switches can be arranged in parallel (instead of being in series) to improve losses. However, the power amplifiers 20, 30 can be connected in parallel, as shown in FIG. 8, through separate matching elements 22, 32 to match the output impedance of the respective power amplifiers in the "off"-stage. With proper matching, the power amplifier in the "off"-stage appears as an open circuit at the node 34. In the optimal case, the output impedance of an "off"-stage power amplifier can be defined, and only passive matching is required. An exemplary matching element is shown in FIG. 10*a*. As shown in FIG. 10*a*, only passive elements such as coils and capacitors are used. Alternatively, diodes are added as switches, as shown in FIG. 10*b*. The diode connected to the power amplifier in "off"-stage will be biased on, to present an open circuit at the input node. The switches can be PIN diodes, CMOS or any suitable solid state switches, for example.

The transmitter module 10, according to the present invention, can be integrated with a transceiver module 60 of the lower 900 GSM bands. As shown in FIG. 11, the antenna 12 in the front-end 5 is operatively connected to a band-reject filter 40 of the present invention and a Tx harmonic filter 80 for the lower GSM bands. In the transceiver module 60, a 900 MHz Tx bandpass filter 62, a balun 64, a power amplifier 66 are operatively connected to the antenna 12 via a diode 68 for signal transmission. For reception, a 900 MHz Rx bandpass filter 70, a balun 72, and a matching filter 76 are operatively connected to the antenna 12. The matching filter 76 can be a λ/4 transmission line. The diodes 68, 74 are both unbiased in the 900 MHz Rx mode so that the 900 MHz power amplifier 66 appears to have a very high impedance. The diodes 68, 74 are both biased in the 900 MHz Tx mode so that the 900 MHz power amplifier 66 sees a low insertion loss path to the antenna 12, while the matching filter 76 transforms the low impedance of the diode 74 to appear as open circuit at the antenna port. As such, only one of the 900 MHz branches is electrically "visible" at the antenna port when the mobile terminal is in the 900 MHz Tx or Rx mode.

Figure 12:
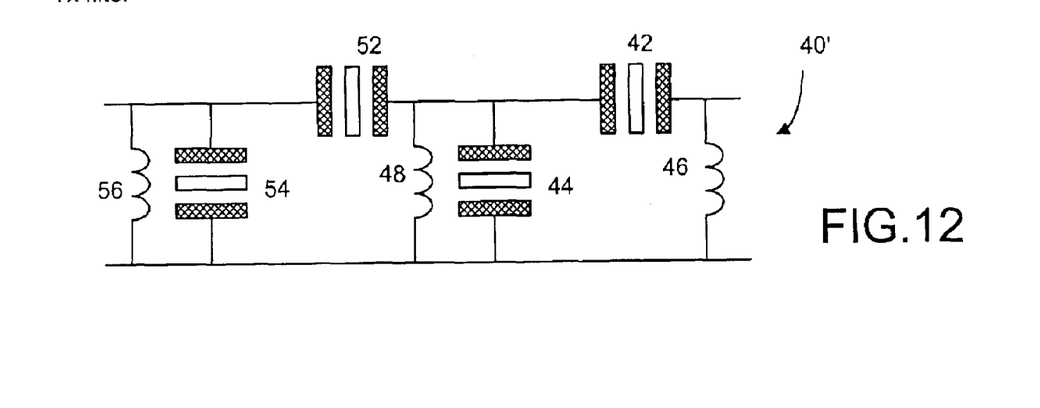
FIG. 12 is a schematic representation showing a band-reject filter having two L-sections, according to the present invention.

It should be noted that the band-reject filter 40 as shown in FIG. 8 consists of only one L-section of the ladder filter. It is possible to use two or more L-sections in such a band-reject filter. A band-reject filter 40' with two L-sections is shown in FIG. 12. As shown, two series resonators 42, 52, two shunt resonators 44, 54 and three coils 46, 48, 56 are used.

Figure 13:
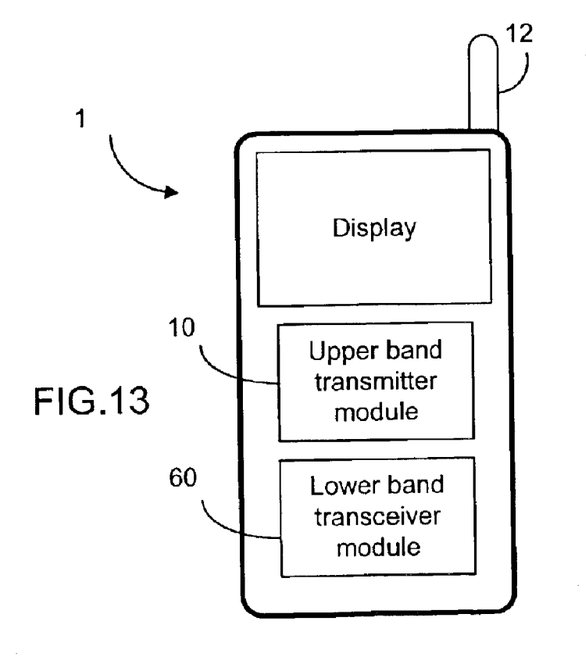
FIG. 13 is a schematic representation illustrating a mobile terminal having a band-rejection filter, according to the present invention.

When the front-end 5 is used in a mobile terminal 1, as shown in FIG. 13, the size and performance (insertion loss and attenuation on the Rx frequency) of the Tx filtering can be significantly improved, especially in the mobile terminal that includes both GSM and CDMA. The transmitter module 10 is also useful in a mobile terminal operating only in GSM or CDMA. The major advantage of the transmitter module 10 is that only one acoustic-wave filter can be used to filter all the upper bands (1800, 1900 and W-CDMA).

In sum, the band-reject filter for use in the front-end of a multiband mobile phone, according to the present invention, provides a reasonably wide passband below the rejection frequency region. If the rejection region is chosen to be the W-CDMA receive frequency (in Europe 2110–2170 MHz), the bandpass region can cover the W-CDMA transmit frequency as well as the 1800 and 1900 GSM transmit frequencies: 1710–1785, 1850–1910 and 1920–1980 MHz. With additional resonators, it is also possible to create a notch for the blue-tooth frequency.

The present invention has been disclosed in conjunction with bulk acoustic wave (BAW) resonators and filters. However, the same principle can be applied to surface acoustic wave (SAW) counterparts. Thus, the resonators 42, 44, 52, 54 as depicted in FIGS. 8 and 12 can be BAW or SAW resonators. Furthermore, the present invention has been disclosed in conjunction with European GSM and W-CDMA bands to demonstrate the benefits of the invention. It should be appreciated that the same invention can be applied to certain other bands and band combination as well. For example, the upper bands could be one or more of the European GSM 1800 band (Tx frequency band of 1710–1785 MHz, Rx frequency range of 1805–1880 MHz), the U.S. GSM 1900 band (Tx frequency range of 1850–1910 MHz, Rx frequency range of 1930–1990 MHz), and the forthcoming U.S. W-CDMA (Tx frequency range of 1710–1770 MHz, Rx frequency range of 2110–2170 MHz). It is also possible to replace the GSM 1900 by the US 1900CDMA, which is located substantially at the same frequency as the GSM 1900. Here the GSM branch would probably need some additional filtering.

Moreover, separate power amplifiers 20 and 30 are used to amplify the transmit signals in the GSM branch and the transmit signals in the W-CDMA branch. However, if the linearity and efficiency of a certain power amplifier can meet the requirements of transmit signals in both branches, it is possible to use a signal amplifier for carrying out the amplification. In that case, the matching of such single amplifier would be different from the matching of two separate amplifiers as shown in FIG. 8. Nevertheless, the band-reject filter of the present invention is still applicable.

Thus, although the invention has been described with respect to a preferred embodiment thereof, it will be understood by those skilled in the art that the foregoing and various other changes, omissions and deviations in the form and detail thereof may be made without departing from the scope of this invention.

What is claimed is:

1. A method of filtering transceiver signals in a mobile terminal, the mobile terminal operable in at least one transmit frequency band and one receive frequency band separated from the transmit frequency band, wherein the mobile terminal has a signal source for providing transmit signal in the transmit frequency band, said method comprising the steps of:
provide a signal path between the signal source and an antenna; and
providing a band-reject filter in the signal path so as to attenuate signal in the receive frequency band, wherein the band-reject filter comprises:
at least one series resonator operatively connected between the signal source and the antenna, the series resonator having a first end and an opposing second end, with the first end connected to the signal source;
at least one shunt resonator connecting between the second end of the series resonator and a grounding point, the shunt resonator and the series resonator forming an L-section; and
at least one inductor connected in parallel with the L-section.

2. The method of claim 1, wherein the transmit frequency band substantially occupies a frequency range of 1920 to 1980 MHz, and the receive frequency band substantially occupies a frequency range of 2110 to 2170 MHz.

3. The method of claim 2, wherein the mobile terminal operates in a code-division multiple access (CDMA) mode.

4. The method claim 3, wherein the further transmit frequency band substantially occupies a frequency range of 1710 to 1770 MHz.

5. The method of claim 3, wherein the further transmit frequency band substantially occupies a frequency range of 1710 to 1785 MHz.

6. The method of claim 3, wherein the further transmit frequency band substantially occupies a frequency range of 1850 to 1910 MHz.

7. The method of claim 3, wherein the mobile terminal is operable in a code division multiple access (CDMA) mode in said at least one transmit frequency band and one receive frequency band, and also operable in a GSM mode in said further transmit frequency band.

8. The method of claim 7, further comprising the step of providing a harmonic trap, operatively connected to the band-reject filter, for attenuating a harmonic of the GSM mode.

9. The method of claim 1, wherein the mobile terminal is also operable in a further transmit frequency band, the mobile terminal further having a further signal source for providing a further transmit signal in the further transmit frequency band, said method further comprising the step of
operatively connecting the further signal source to the signal path at the first end of the series resonator.

10. The method of claim 1, wherein the series resonator comprises an acoustic wave resonator and the shunt resonator comprises another acoustic wave resonator.

11. The method of claim 1, wherein the series resonator comprises a bulk acoustic wave resonator and the shunt resonator comprises another bulk acoustic wave resonator.

12. A band-reject filter for use in a mobile terminal, the mobile terminal operable in at least one transmit frequency band and one receive frequency band separated from the transmit frequency band, wherein the mobile terminal has a signal source for providing transmit signal in the transmit frequency band, and a signal path between the signal source and an antenna, said filter comprising:
at least one series resonator operatively connected to the signal path between the signal source and the antenna, the series resonator having a first end and an opposing second end, with the first end connected to the signal source;
at least one shunt resonator connecting between the second end of the series resonator and a grounding point, the shunt resonator and the series resonator forming an L-section; and
at least one inductor connected in parallel with the L-section.

13. The filter of claim 12, wherein said at least one inductor is connected between the first end of the series resonator and the grounding point, said band-reject filter further comprising
a further inductor connected between the second end of the series resonator and the grounding point.

14. The filter of claim 12, wherein the series resonator comprises an acoustic wave resonator and the shunt resonator comprises another acoustic wave resonator.

15. The filter of claim 12, wherein the series resonator comprises a bulk acoustic wave resonator and the shunt resonator comprises another bulk acoustic wave resonator.

16. The filter of claim 12, wherein the transmit frequency band substantially occupies a frequency range of 1920 to 1980 MHz, and the receive frequency band substantially occupies a frequency range of 2110 to 2170 MHz.

17. A mobile terminal operable in at least one transmit frequency band and one receive frequency band separated from the transmit frequency band, said mobile terminal comprising:
a signal source for providing transmit signal in the transmit frequency band;
a signal path between the signal source and an antenna; and
a band-reject filter operatively connected to the signal path so as to attenuate signal in the receive frequency band, wherein the band-reject filter comprises:
at least one series resonator operatively connected between the signal source and the antenna, the series resonator having a first end and an opposing second end, with the first end connected to the transmission source;
at least one shunt resonator connecting between the second end of the series resonator and a reference point, the shunt resonator and the series resonator forming an L-section; and
at least one inductance connected in parallel with the L-section.

18. The mobile terminal of claim 17, wherein the transmit frequency band substantially occupies a frequency range of 1920 to 1980 MHz, and the receive frequency band substantially occupies a frequency range of 2110 to 2170 MHz.

19. The mobile terminal of claim 18, wherein said transmit signal comprises a code division multiple access (CDMA) signal.

20. The mobile terminal of claim 18, further operable in a GSM900 transmit band, said mobile terminal further comprising
a further signal source, operatively connecting to the antenna, for providing a further transmit signal in the GSM900 transmit band.

21. The mobile terminal of claim 17, also operable in a further transmit frequency band, said mobile terminal further comprising:
   a further signal source, operatively connecting to the signal path at the first end of the series resonator, for providing a further transmit signal in the further transmit frequency band.

22. The mobile terminal of claim 21, wherein the further transmit frequency band substantially occupies a frequency range of 1710 to 1770 MHz.

23. The mobile terminal of claim 21, wherein the further transmit frequency band substantially occupies a frequency range of 1710 to 1785 MHz.

24. The mobile terminal of claim 21, wherein the further transmit frequency band substantially occupies a frequency range of 1850 to 1910 MHz.

25. The mobile terminal of claim 21, wherein the transmit signal comprises a code division multiple access (CDMA) signal, and the further transmit signal comprises a GSM signal.

26. The mobile terminal of claim 25, further comprising a harmonic trap, operatively connected to the band-reject filter, for attenuating a harmonic of the GSM signal.

27. The mobile terminal of claim 26, wherein the harmonic trap is connected to the band-reject filter through a diode which is unbiased when the mobile terminal is in the CDMA mode for transmitting the CDMA signal.

28. The mobile terminal of claim 17, wherein the series resonator comprises an acoustic wave resonator and the shunt resonator comprises another acoustic wave resonator.

29. The mobile terminal of claim 17, wherein the series resonator comprises a bulk acoustic wave resonator and the shunt resonator comprises another bulk acoustic wave resonator.

* * * * *